US006555829B1

(12) United States Patent
Spallas et al.

(10) Patent No.: US 6,555,829 B1
(45) Date of Patent: Apr. 29, 2003

(54) HIGH PRECISION FLEXURE STAGE

(75) Inventors: James P. Spallas, Dublin, CA (US); Lawrence P. Muray, Moraga, CA (US); David Trost, San Francisco, CA (US); Ho-Seob Kim, Asan-si Chungnam (KR); Tai-Hon P. Chang, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/481,103

(22) Filed: Jan. 10, 2000

(51) Int. Cl.[7] .................................................. G01B 9/02
(52) U.S. Cl. .................................... 250/492.2; 310/328
(58) Field of Search ........................... 250/492.2, 491.1, 250/496.1, 522.1

(56) References Cited

U.S. PATENT DOCUMENTS

| | | | | |
|---|---|---|---|---|
| 4,694,477 A | | 9/1987 | Siddall | 378/34 |
| 5,260,622 A | | 11/1993 | West | 310/328 |
| 5,327,388 A | | 7/1994 | Allen et al. | 346/108 |
| 5,386,221 A | | 1/1995 | Allen et al. | 346/108 |
| 5,644,137 A | | 7/1997 | Waggener et al. | 250/492.2 |
| 5,760,564 A | | 6/1998 | Novak | 318/687 |
| 5,808,302 A | | 9/1998 | Binnig et al. | 250/306 |
| 5,815,245 A | | 9/1998 | Thomas et al. | 355/53 |
| 5,874,820 A | | 2/1999 | Lee | 318/575 |
| 5,953,126 A | | 9/1999 | Zavislan | 356/376 |
| 5,959,721 A | | 9/1999 | Nishi | 355/53 |
| 5,982,128 A | * | 11/1999 | Lee | 318/568.16 |
| 6,324,933 B1 | * | 12/2001 | Waskiewicz et al. | 74/490.01 |

OTHER PUBLICATIONS

Quickpack® Piezo Electric Actuators, Active Control eXperts, Inc., 1997, 22 pages total.
Morgan Matrock, Inc., Electro Ceramics Division, "Guide to Modern Piezoelectric Cermics", Jul. 1997, 5 pages total.

* cited by examiner

*Primary Examiner*—John R. Lee
*Assistant Examiner*—Anthony Quash
(74) *Attorney, Agent, or Firm*—Jung-hua Kuo

(57) ABSTRACT

Disclosed is a positioning stage for precisely positioning an object within a limited range of travel (e.g. 100 μm). By way of example, the stage can be used to position an electron source such as a field emitter in an electron beam micro-column. The stage includes a block which defines a channel to allow flexure along a first axis. The block also defines another channel to allow flexure along a second axis perpendicular to the first axis. Using actuators in the channels to flex a portion of the block, the object supported by the block can be precisely positioned to a desired location in a horizontal plane defined by the first and second axes.

20 Claims, 11 Drawing Sheets

HIGH PRECISION FLEXURE STAGE

STATEMENT REGARDING FEDERALLY SPONSORED RESEARCH

This invention was made with government support under contract number N00019-98-C-0025 awarded by the Department of the Navy. The U.S. Government may have certain rights in this invention.

BACKGROUND OF THE INVENTION

1. Field of the Invention

This invention generally relates to positioning mechanisms and more specifically to highly precise positioning stages having limited amount of travel.

2. Description of the Related Art

Mechanisms for positioning an object, in general, are well known. For instance, in the semiconductor industry, various "stages" are used to position a semiconductor wafer during its fabrication process. Stages are also used to support and move an electron source (also referred to as "field emitter"; e.g. Schottky field emitter, thermal field emitter) in an electron beam microcolumn ("microcolumn"). Microcolumns are physically short electron beam columns that output low-energy electron beams (typically 1–2 keV). Microcolumns are structures based on microfabricated electron "optical" components and field emission sources and may be used for lithography. Microcolumns are well known; see, for instance, "Electron-Beam Microcolumns for Lithography and Related Applications" by T. H. P. Chang, et al., *Journal of Vacuum Science Technology Bulletin* 14(6), pp. 3774–81, November/December, 1996, incorporated herein by reference.

Friction walkers (also known as "inertial walkers" or "piezoelectric walkers") are well known and have been employed to support and move field emitters in microcolumns. Typically, a friction walker has a base, which supports a field emitter, and several piezoelectric modules that are actuated in a "walking" pattern to move the base, and thus the field emitter, in a straight line. Two separate stages of friction walkers, one for the X-axis and another for the Y-axis, are used to position the field emitter in an X-Y plane.

A problem with friction walkers is that they are difficult to precisely align to a location. Because a friction walker positions a field emitter using a series of discrete steps and the distance traveled with each step varies, a destination location can be missed if a step towards the destination location is longer or shorter than any of the other steps. It is desirable to have a stage with continuous motion to be able to continuously move and then stop the stage once the destination location is reached.

Another problem with friction walkers and other similar stages in the prior art is that they are bulky and occupy a large volume. For example, two stacked stages (on separate horizontal planes) are typically used to achieve movement in two orthogonal directions. It is desirable to have a compact stage for a variety of reasons including to provide more room for other components in the lithography (or other) system wherein the stage is used. For instance, in a lithography system for creating patterns on masks with moveable field emitters, a compact stage allows more field emitters to be packed in a given area, thereby increasing the system's throughput.

From the foregoing, a precise and compact positioning stage is highly desirable.

SUMMARY

The invention relates to a precise and compact positioning stage for very small (e.g. 100 μm, which is 0.1 mm) amounts of travel. A typical application (not limiting) is in an electron beam lithography system using microcolumns. In one embodiment, the stage includes a block which supports the object (e.g. field emitter) to be positioned. The block defines a channel that allows the block to flex along a first axis. Another channel in the block allows the block to flex along a second axis which is perpendicular to the first axis. Actuators are located in the channels to flex the block and thus position the object supported by the block to a desired location in a horizontal plane defined by the first and second axes. In another embodiment, an array of such independently controlled positioning stages is used to position multiple objects.

This stage typically provides very precise but also typically limited amounts of travel in two orthogonal directions.

DETAILED DESCRIPTION

The invention relates to a precise and compact positioning stage. While the invention is described in the context of positioning a field emitter in a microcolumn, the invention may be used in any application wherein accurate positioning of an object, such as a workpiece or a device, within a limited range of travel is desired. The invention can be used in a variety of systems including, for example, in electron beam and laser beam lithography systems from Etec Systems, Inc. of Hayward, Calif. (Internet web site "www.etec.com").

Figure 1:
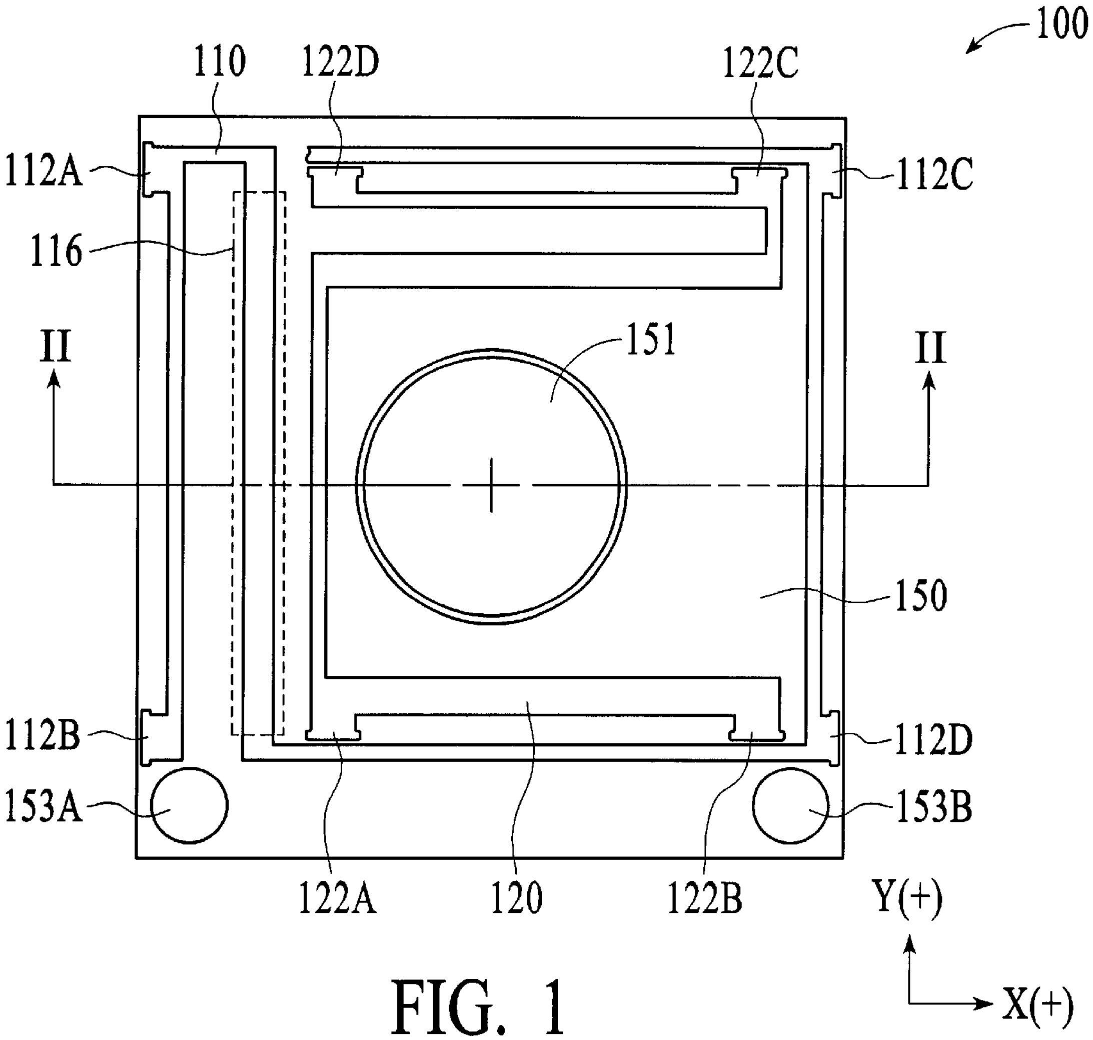
FIG. 1 shows a plan view of a positioning stage in accordance with the present invention.
Figure 2:
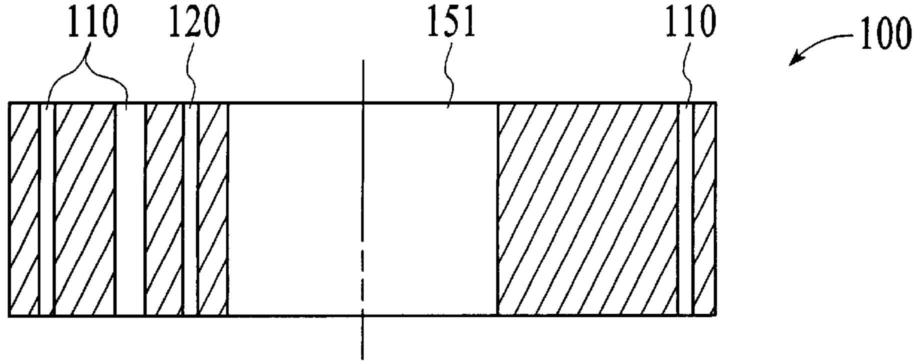
FIG. 2 shows a cross-sectional view of the positioning stage shown in FIG. 1.

FIG. 1 shows a plan view of a positioning stage 100 in accordance with the present invention while FIG. 2 shows a corresponding cross-sectional view taken along section line II—II in FIG. 1. Stage 100 defines a channel (cut-out) 110, a channel 120, and an aperture 151 which are formed through a block 150 by, for example, electrical discharge machining (EDM). Block 150 in this example is of beryllium-copper (Be—Cu) but may also be of other materials such as silicon, tungsten, and titanium. Preferably, block 150 is of a material which has a high Young's modulus (i.e. modulus of elasticity) and yield strength. Block 150 may be fashioned using a variety of techniques suitable to the chosen material. For example, micro-machining may be used to fashion a block 150 made of silicon.

Channels 110 and 120 allow limited movement in two orthogonal directions in the X-Y plane of block 150. Channel 110 allows stage 100 to flex in the X-direction while channel 120 allows stage 100 to flex in the Y-direction. As illustrated in FIG. 1, channel 110 defines flexure bearings 112A, 112B, 112C, and 112D. Similarly, channel 120 defines flexure bearings 122A, 122B, 122C, and 122D. Except for differences in orientation, all flexure bearings of stage 100 are otherwise the same. Holes 153A and 153B are provided for conventionally mounting stage 100 onto an assembly such as, for example, an electron beam microcolumn assembly.

Figure 3A:
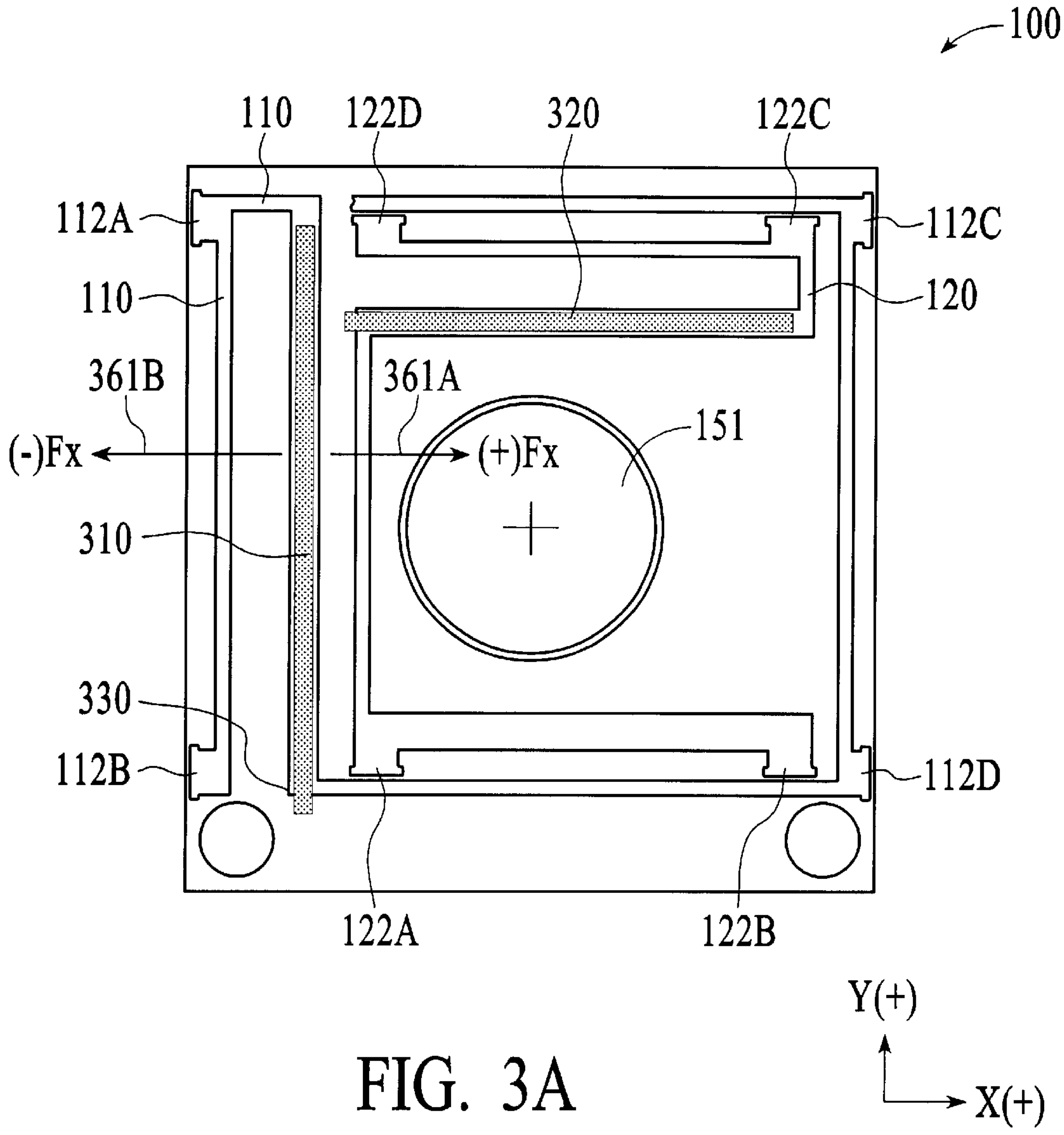
FIG. 3A shows a plan view of the positioning stage shown in FIG. 1 fitted with actuators.

Whereas the following describes channel 110 and the movement of stage 100 in the X-direction, the same illustration also applies to channel 120 and the movement of stage 100 in the Y-direction. Because of the geometry of stage 100, a particular force applied anywhere on the sidewalls of channel 110 in a region 116 produces the same movement in the X-direction. In other words, movement in the X-direction is dependent on the magnitude of the applied force, not where the force is applied on the sidewalls of channel 110 in region 116. Such a force can be provided, for example, by a bimorph piezoelectric actuator such as those commercially available from Active Control Experts, Inc. of Cambridge, Massachusetts (Internet web site "www.acx.com") and the Electro Ceramics Division of Morgan Matroc, Inc., Bedford, Ohio (Internet web site "www.morganmatroc-ecd.com" or "www.morganmatroc.com"). Other types of actuators may also be used including capacitively driven actuators. FIG. 3A shows a plan view of stage 100 having actuators 310 and 320 located in channels 110 and 120, respectively. One end of actuator 310 is fixedly attached in a corner 330. When an electrical voltage (not shown) is applied on actuator 310, actuator 310 bends (i.e. deflects), thereby applying a force $F_x$ (indicated as arrows 361A and 361B in FIG. 3A) on the sidewalls of channel 110. Depending on the polarity of the applied voltage, actuator 310 bends in the negative or positive X-direction. The resultant movement in the X-direction correspondingly moves an object mounted in aperture 151. In this example, stage 100 provides up to 100 $\mu$m of movement in the X-direction in an ultra-high vacuum (UHV) environment. Movement of up to 100 $\mu$m in the Y-direction under UHV is similarly achieved using channel 120 and actuator 320. Depending on the application, other ranges of motion are also possible.

Figure 3B:
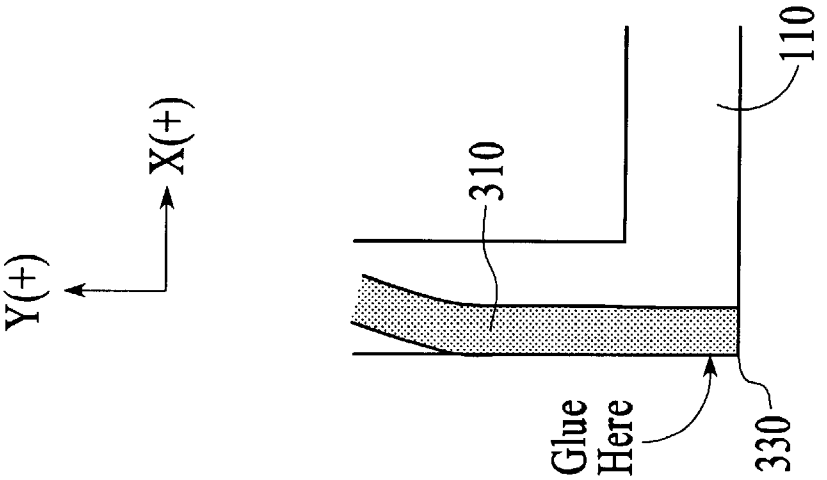
FIGS. 3B, 3C, 3D, and 3E depict various ways of installing actuators in the positioning stage shown in FIG. 3A.
Figure 3C:
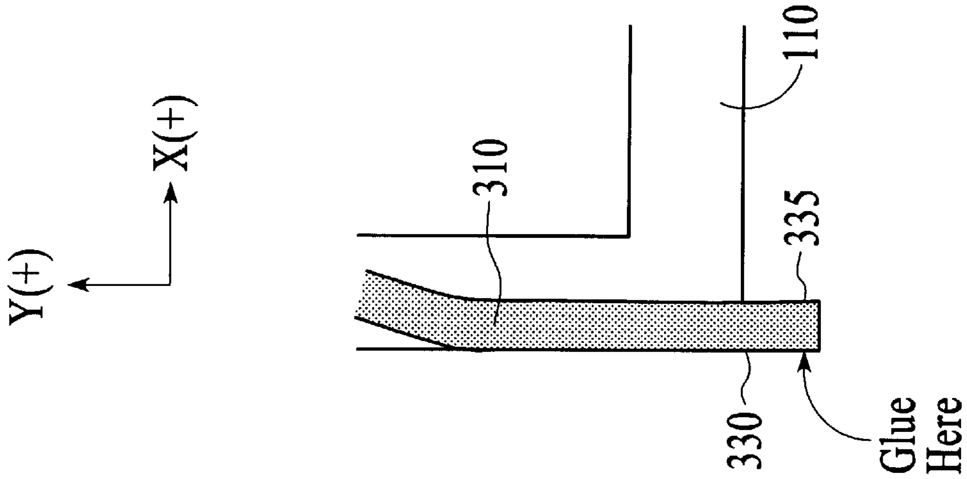
Figure 3D:
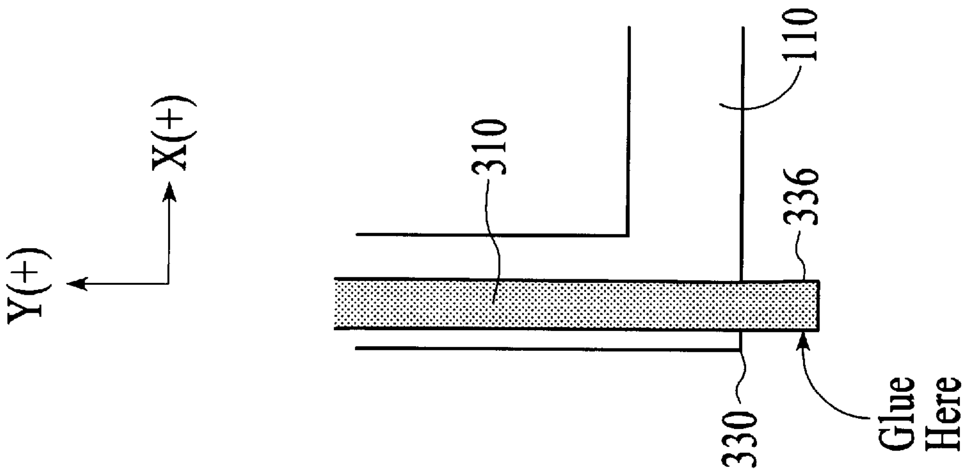
Figure 3E:
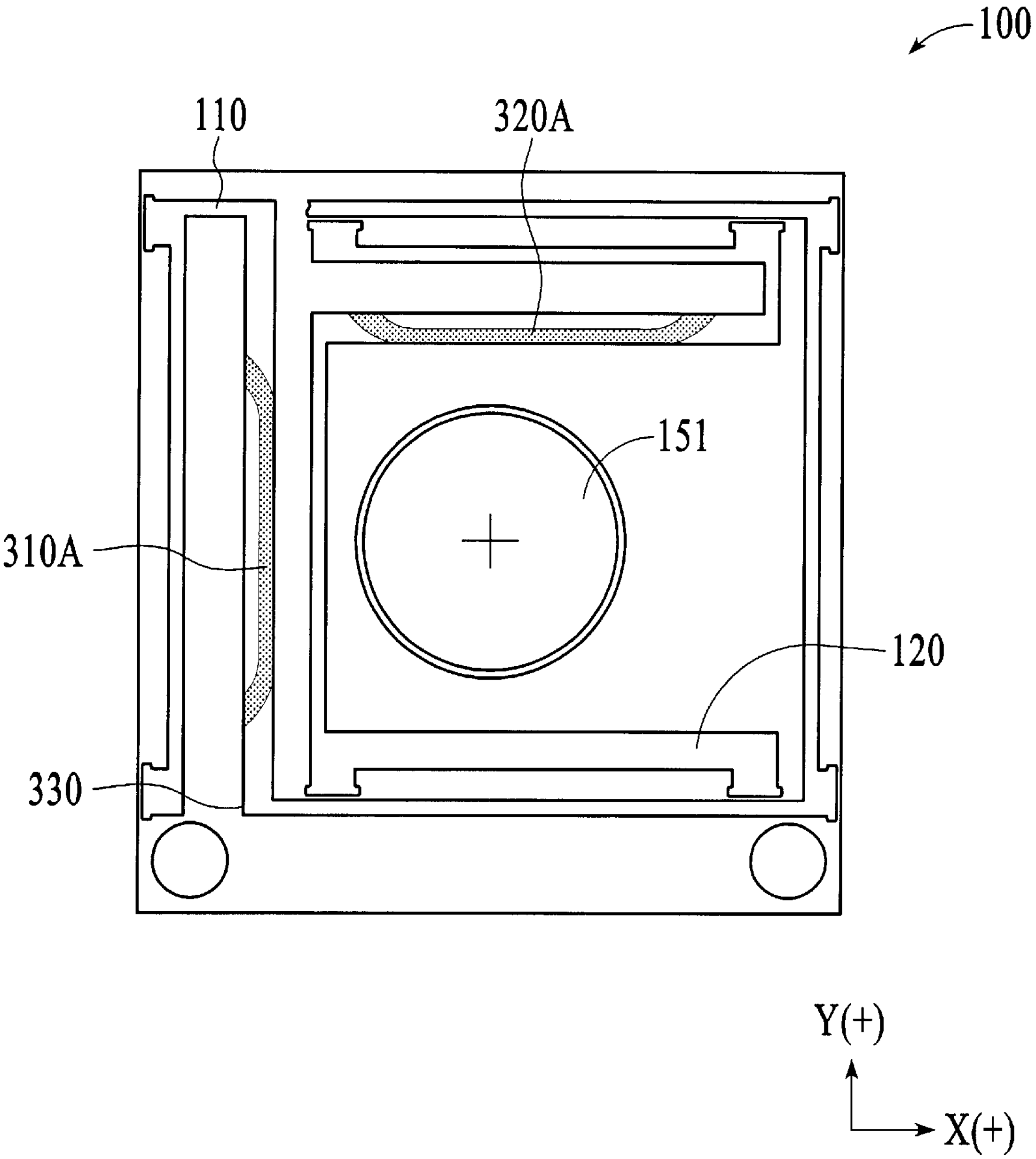

As shown in FIG. 3B, actuator 310 is attached in corner 330 by bonding (e.g. with epoxy) the lower portion of actuator 310 on a sidewall of channel 110. Actuator 310 can also be inserted and bonded in a notch 335 as shown in FIG. 3C or in a notch 336 as shown in FIG. 3D. Attaching actuator 310 in a notch 336 as shown in FIG. 3D is ideal because the actuator can be deflected within its full range of motion. However, the required area to firmly clamp actuator 310 in notch 336 may be too large for some applications. In that case attaching actuator 310 in notch 335 as shown in FIG. 3C is preferred. Note that in FIG. 3C, the range of motion of actuator 310 is cut in half (i.e. actuator 310 can only be effectively deflected in the positive X-direction). This may necessitate offsetting the center of aperture 151 in the negative X-direction with respect to the center of stage 100 to be able to move an object mounted in aperture 151 to both the left and the right of the center of stage 100. An actuator 310A may also be located in channel 110 as shown in FIG. 3E. In FIG. 3E, actuator 310A "pushes" aperture 151 and any object mounted therein in the X-direction when an electrical voltage is applied on actuator 310A. Of course, the above description and placement of actuators 310 and 310A similarly apply to their counterparts in the Y-direction which are actuators 320 and 320A.

Stage 100 provides continuous, rather than discrete, motion in both the X and Y directions, thereby allowing an object in aperture 151 to be precisely positioned. Further, movement in the X and Y directions can be performed without hysteresis. That is, displacement along an axis is the same (and repeatable) for the same magnitude of applied force. Although the X and Y movements are mechanically coupled in stage 100 and other stages in accordance with the invention, unintended movement due to the coupling is negligible. In one embodiment, movement of 100 $\mu$m along one axis results in a mere 100 nm (i.e. 0.1 $\mu$m) of unintended movement along the other axis.

Figure 4:
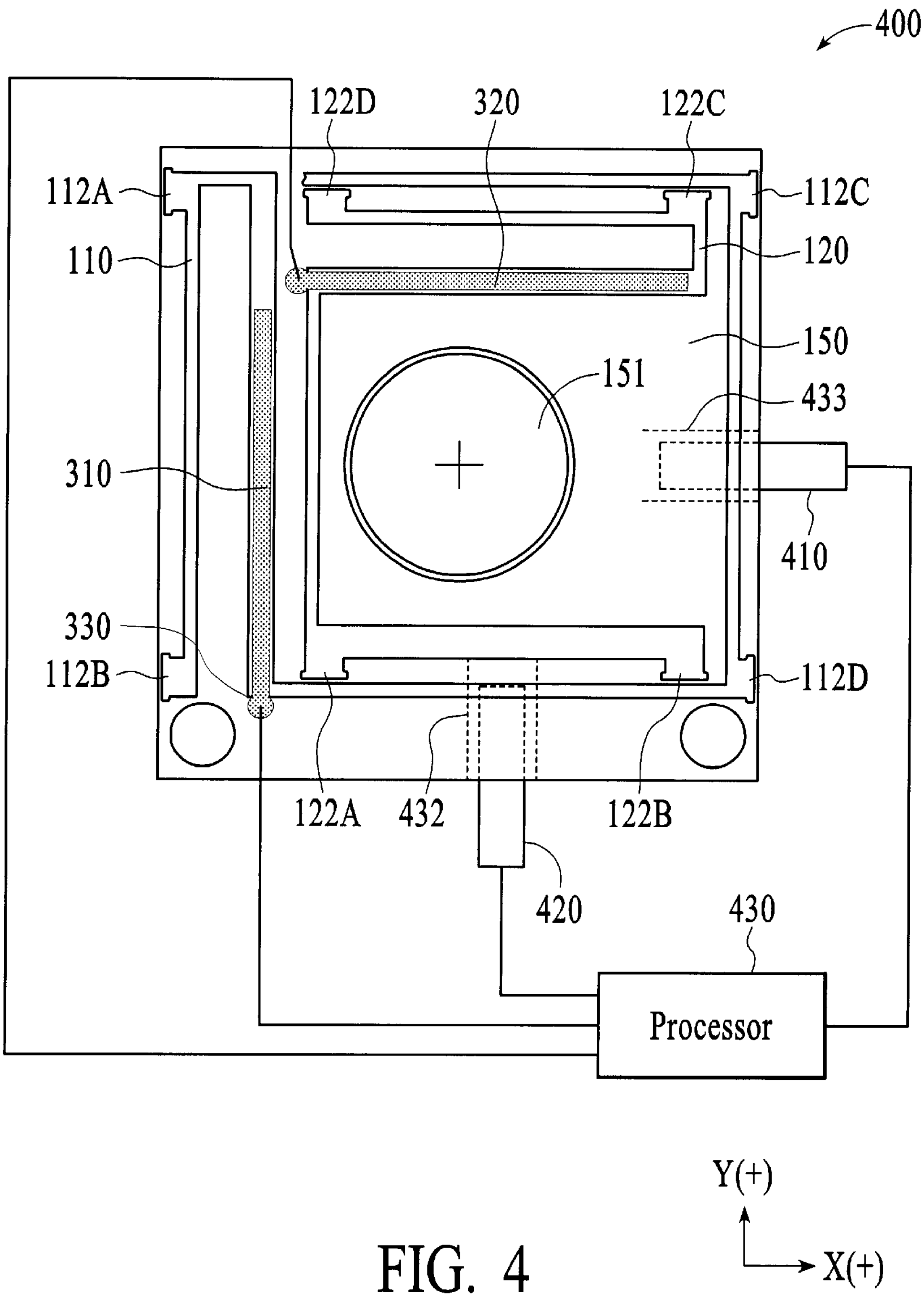
FIG. 4 shows in schematic form a closed-loop feedback control system used in a positioning stage in accordance with the present invention.

In an embodiment of the invention shown in FIG. 4, transducers 410 and 420 monitor the X and Y movement, respectively, of a stage 400. Except for the addition of hole 433, hole 432, transducer 410, and transducer 420, stage 400 is otherwise identical to stage 100. Hole 432 is drilled through block 150 so that transducer 420 can be attached onto a wall of block 150 normal to the Y-axis, thereby allowing monitoring of movement in the Y-direction. Similarly, transducer 410 is attached onto a wall normal to the X-axis through hole 433 to monitor movement in the X-direction. Transducers 410 and 420 may be any conventional displacement transducers including differential variable reluctance transducers ("DVRT"). The output signals of transducers 410 and 420 are monitored by a processor 430 which also controls the bending (i.e. deflection) of actuators 310 and 320. Processor 430 is a conventional computer with data acquisition and control circuit boards to interface with the stage. Actuators 310 and 320, transducers 410 and 420, and processor 430 form a closed-loop feedback control system which enables processor 430 to precisely position an object mounted in aperture 151 and indefinitely hold the object in that position. By storing the position coordinates in non-volatile memory (e.g. hard disk drive, flash memory), processor 430 can repeatedly position the object in the same position even if processor 430 or an actuator has been powered off.

Figure 5:
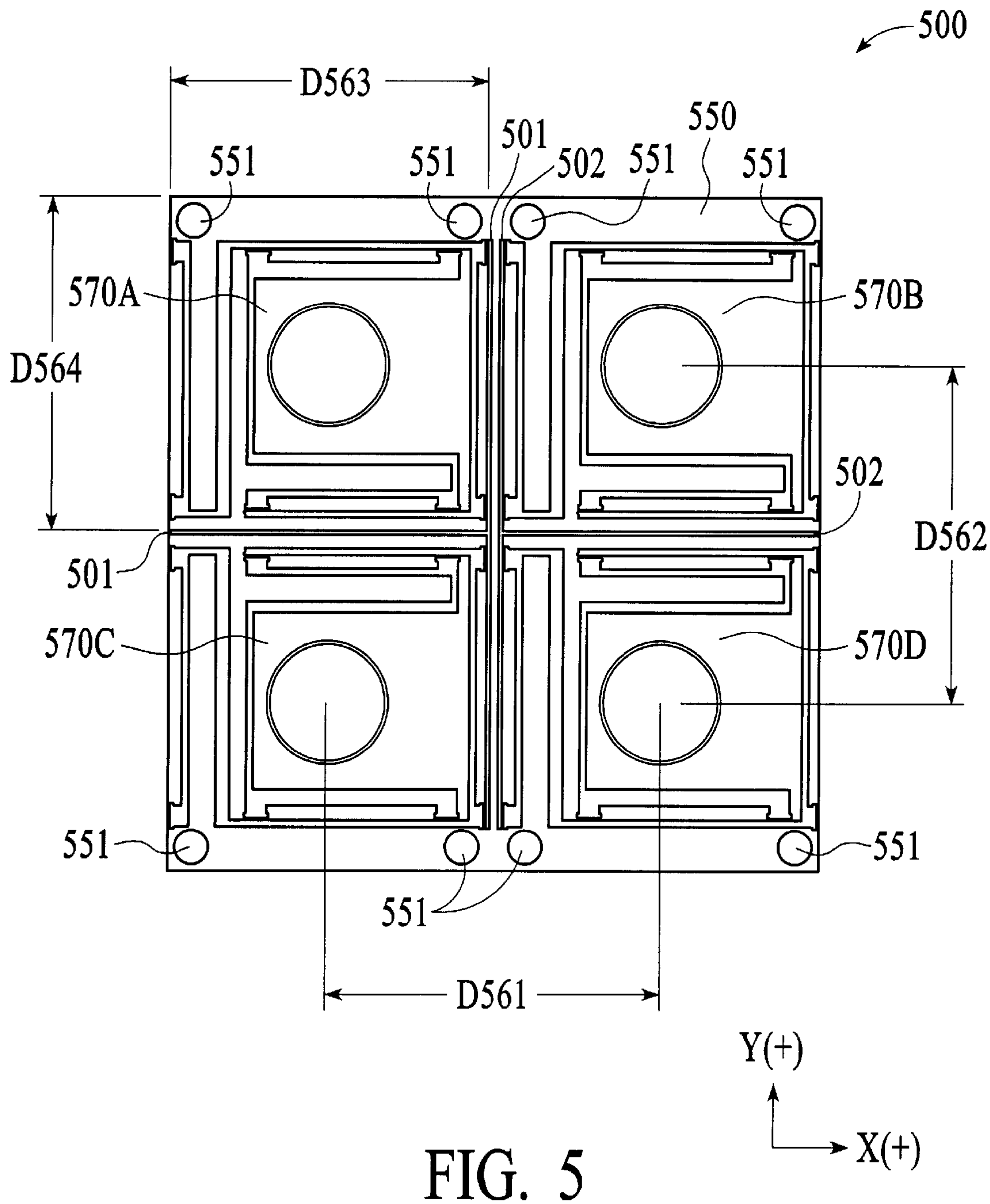
FIG. 5 shows a plan view of an array of positioning stages in accordance with the present invention.

In an embodiment of the invention, a stage array 500 includes an array of stages as illustrated in FIG. 5. Stage array 500 has stages 570A, 570B, 570C, and 570D which are fabricated by, for example, electrical discharge machining a block 550. Channels 501 and 502 are formed through block 550 to mechanically decouple the stages from one another while holes 551 are provided for mounting stage array 500 onto an assembly. Stages 570A, 570B, 570C, and 570D are otherwise identical to stage 100. While stages 570A, 570B, 570C, and 570D are fabricated in a single block (i.e. monolithic), individual (i.e. separately fabricated) stages 100 may also be used to build a stage array. However, machining methods allow a monolithic stage array to be fabricated with better accuracy than an array of individual stages. For example, wire EDM can be used to fabricate a monolithic stage array wherein the stages are accurately placed relative to each other (as a unit) and relative to a fixed reference point. This is much better than having to align individual stages into a stage array. Although stage array 500 uses four (4) stages in this example, the invention is not so limited and may use any number of stages. For instance, a stage array having two (2) stages can be fabricated to minimize the number of field emitters which have to be removed in case a field emitter in a stage array malfunctions. With reference to FIG. 5, table 1 provides the dimensions of a stage array 500 made of beryllium-copper.

TABLE 1

| DIMENSION | VALUE in millimeters (mm) |
|---|---|
| D561 | 20.0 |
| D562 | 20.0 |
| D563 | 19.5 |
| D564 | 19.5 |

Figure 6:
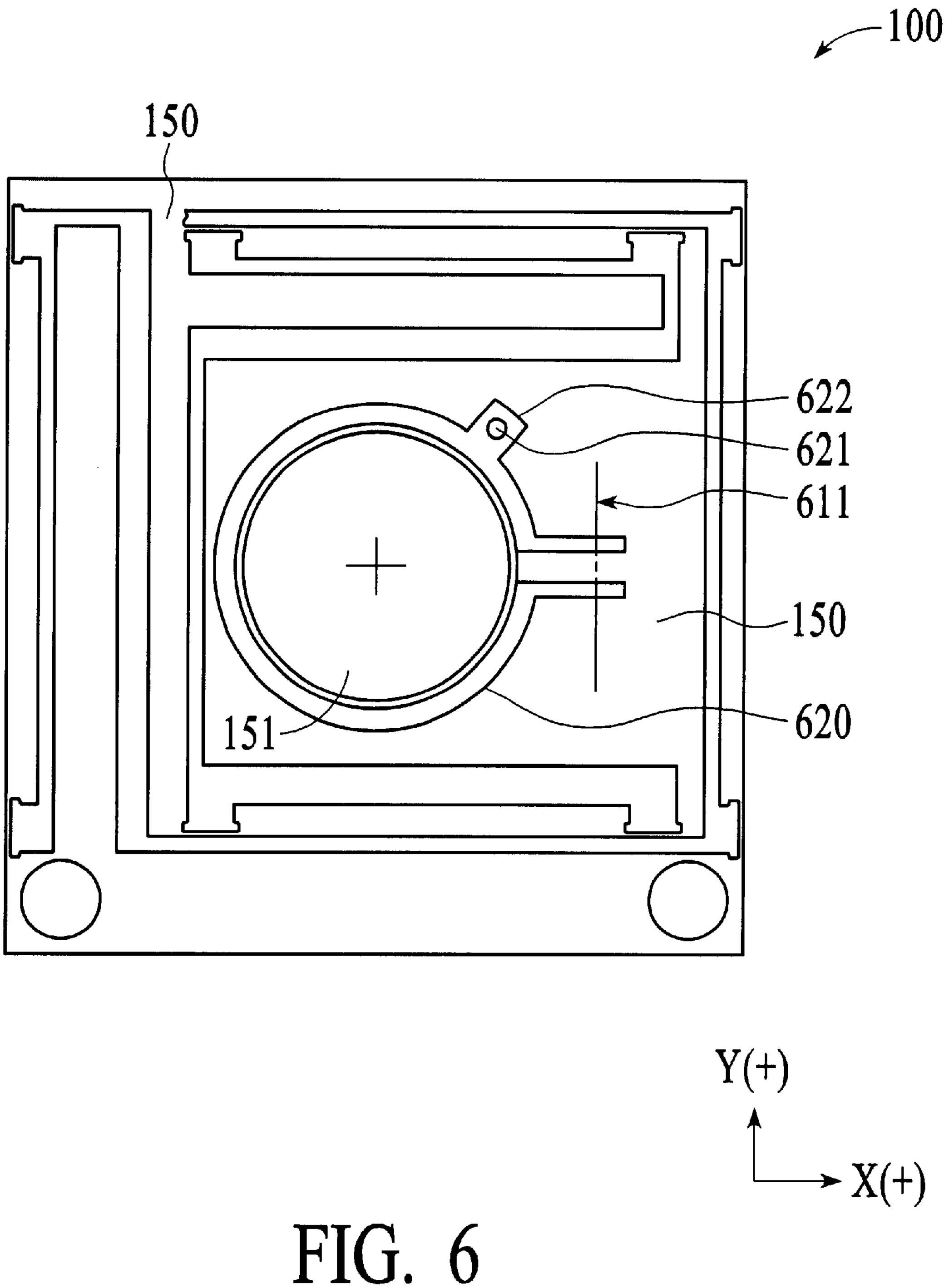
FIG. 6 depicts the use of a c-clamp used in the positioning stage shown in FIG. 1.

Referring to FIG. 6, a Schottky field emitter (not shown), for example, may be mounted in aperture 151 of stage 100 using a c-clamp 620. The field emitter is clamped in place using a nut and bolt (not shown) through a line 611. A tab 622 defines a hole 621 through which a screw (not shown) fastens c-clamp 620 onto block 150. Hole 621 is made larger than the outside diameter of the screw to allow c-clamp 620, and thus the field emitter, to be moved within aperture 151 during coarse alignment of the field emitter. For the same reason, the diameter of aperture 151 is larger than that of the field emitter. While aperture 151 has a circular shape in stage 100, aperture 151 may be of any suitable shape to accommodate the profile of the object supported by stage 100.

Figure 7:
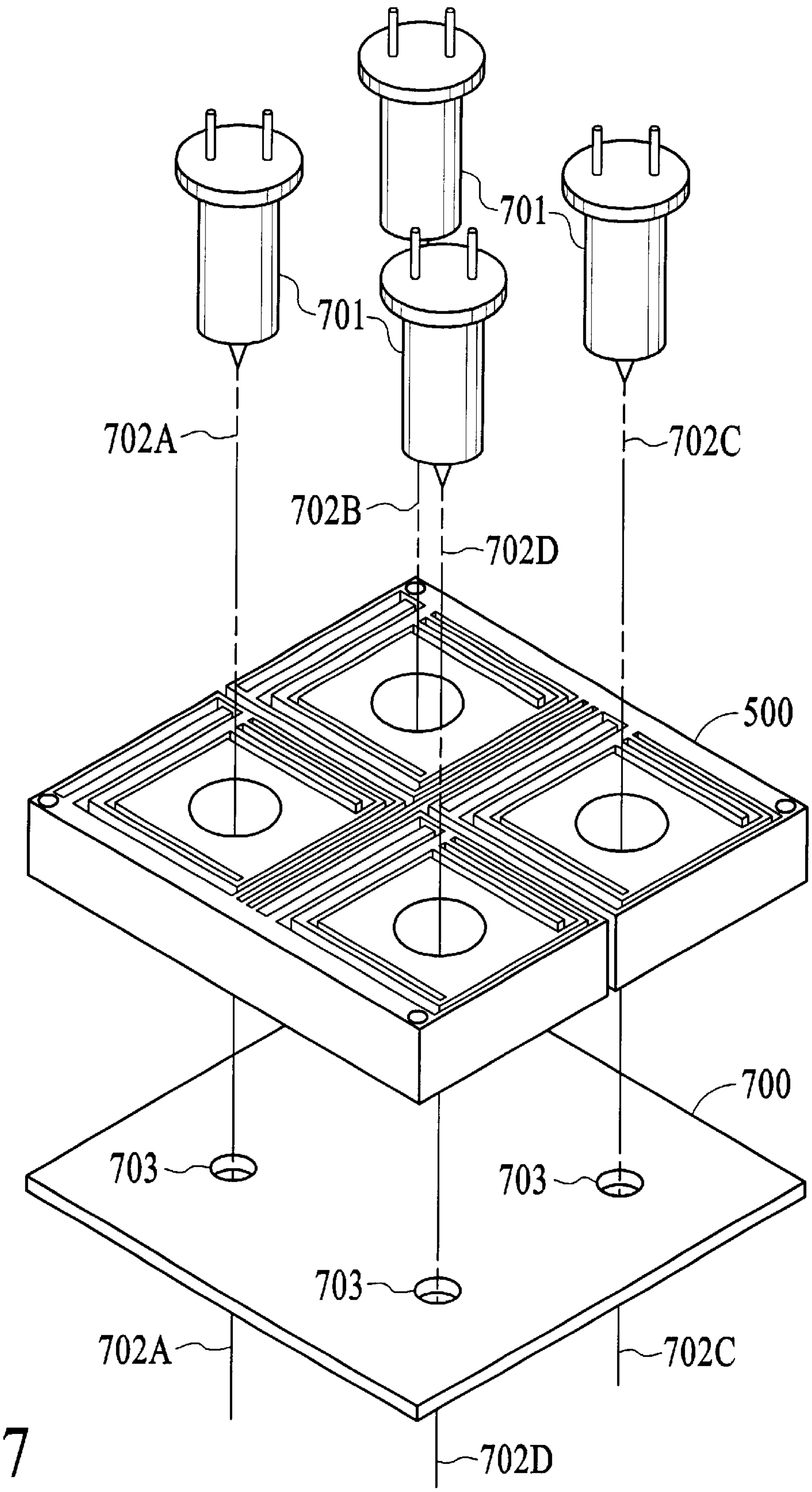
FIG. 7. shows a perspective view of an alignment template for use in coarse aligning electron sources in a stage array in accordance with the present invention.

FIG. 7 shows a perspective view of an alignment template 700 for coarse aligning Schottky field emitters 701 to be mounted in a stage array 500 (also shown in FIG. 5) as indicated by dashed lines 702A, 702B, 702C, and 702D. Coarse alignment is performed to position a field emitter such that the range of motion provided by the stages of stage array 500 is sufficient to precisely align the field emitter to the associated microcolumn. This is not a part of use of the microcolumn, but is part of the assembly and alignment process so that the field emitter is properly aligned to its associated microcolumn. Alignment template 700, which may be part of a test stand, allows coarse alignment of the field emitters without having to use an actual microcolumn assembly. In this example, alignment template 700 has four (4) apertures 703, one for each field emitter. The dimensions of alignment template 700, including the size and locations of apertures 703 and mounting holes (not shown), duplicate that of the microcolumn assembly onto which stage array 500 is to be mounted. Apertures 703 may be placed, for example, using conventional lithography techniques. Alignment template 700 in this example is a microfabricated silicon membrane. Other materials may also be used including silicon-nitride ($Si_3N_4$).

Figure 8A:
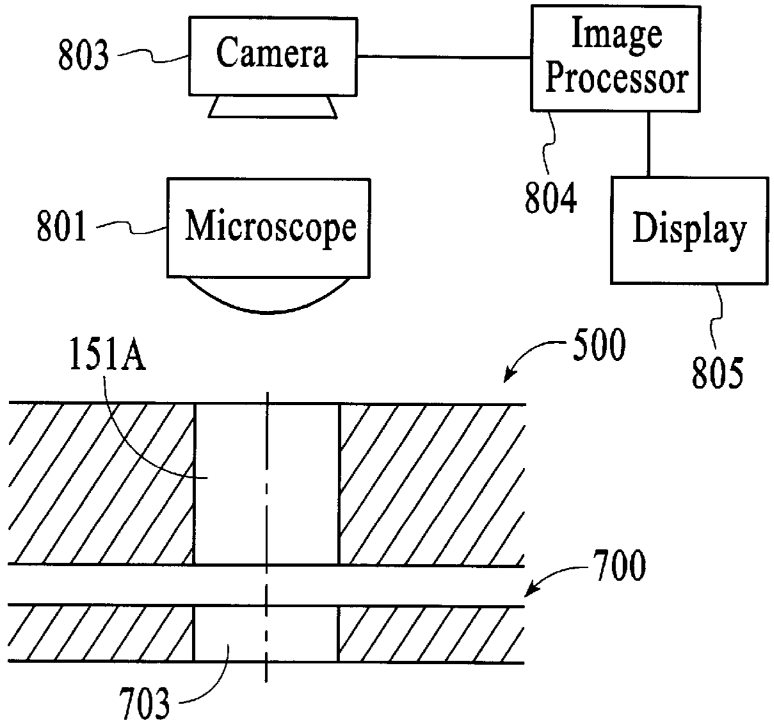
FIGS. 8A–8B show in schematic form a coarse alignment setup in accordance with the present invention.
Figure 8B:
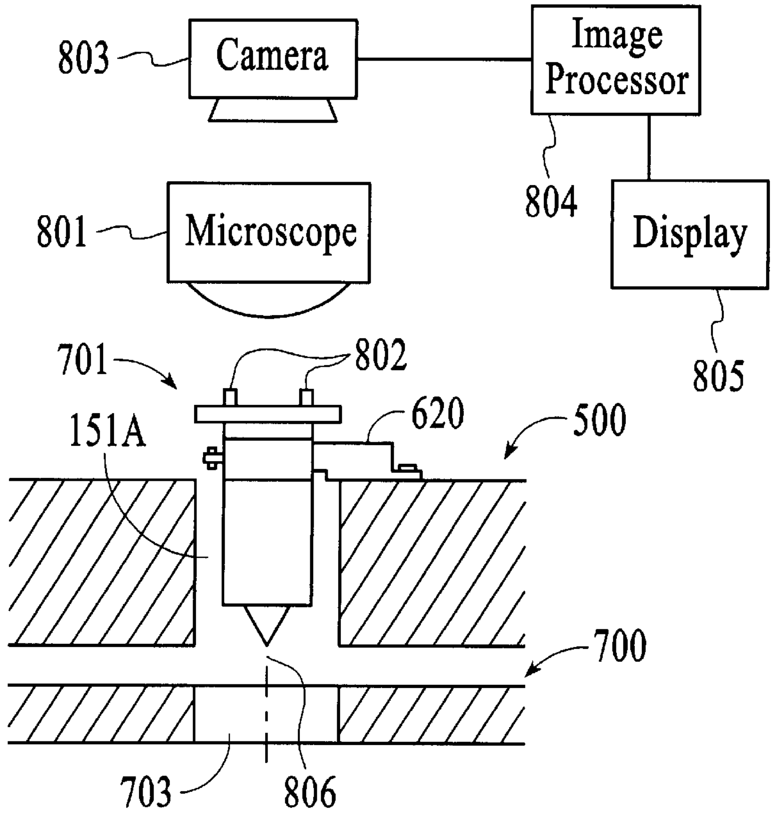

FIGS. 8A and 8B illustrate a way of coarse aligning a field emitter 701 in a stage array 500. In FIG. 8A, stage array 500 is mounted in alignment template 700. A video camera 803 is used to observe through microscope 801 and view an aperture 703 through an aperture 151A. The output signal of camera 803 is coupled to a conventional image processor 804 and is displayed in a display 805. Image processor 804 is, for example, a personal computer equipped with a video frame grabber. Such an image processor is well known. An image of aperture 703 is acquired using image processor 804. The alignment set-up including the position of alignment template 700, stage array 500, microscope 801, and camera 803 relative to each other should not be disturbed after the image is acquired. Otherwise, the coarse alignment will be off. A target image is then created by digitally marking the acquired image with a cross-hair identifying the center of aperture 703. Thereafter, field emitter 701, which includes a tip 806 and electrodes 802, is mounted into aperture 151A as shown in FIG. 8B. Superimposing the target image with the "live" (i.e. real-time) image of field emitter 701 viewed on display 805, the tip or an identifying feature of field emitter 701 is moved to the cross-hair. Field emitter 701 is then clamped into place. In FIG. 8B, tip 806 of field emitter 701 is not viewable on display 805 because tip 806 is facing away from camera 803. By predetermining the location of tip 806 relative to electrodes 802, electrodes 802 can be used as a reference for aligning tip 806 to the cross-hair of the target image. Coarse alignment may also be performed under ultra high vacuum. In which case, an operating field emitter is positioned by moving c-clamp 620 until the field emitter's electron beam, detected using a Faraday cup, is centered in the corresponding template aperture.

After all field emitters 701 are coarse aligned, stage array 500 is mounted on the microcolumn assembly where each field emitter is precision aligned using the X and Y movements provided by its stage block. Precision alignment is performed in an ultra high vacuum environment under operating conditions. The electron beam from each field emitter is scanned and positioned using the X and Y movement provided by the stages in stage array 500. Scanning using the X and Y movement is performed only for precision alignment and not for normal use. After, the field emitter is precision aligned, the field emitter remains in place (i.e. not scanned) unless precision alignment needs to be redone. However, the invention is not so limited and may also be used as a scanning type stage. For example, a stage in accordance with the invention may be used to scan at a frequency of at least 500 HZ.

Figure 9A:
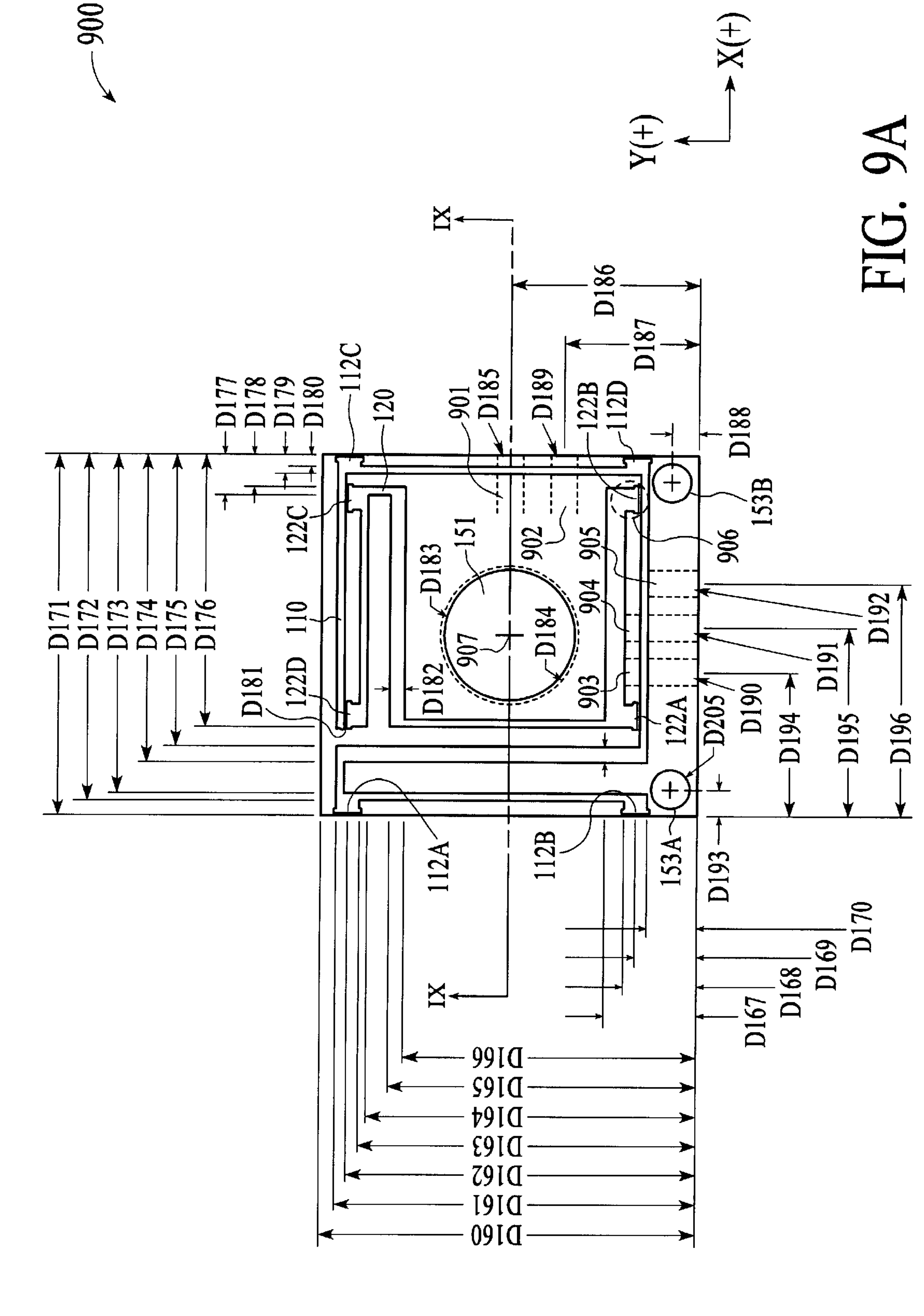
FIG. 9A shows a plan view of a positioning stage in accordance with the present invention.
Figure 9B:
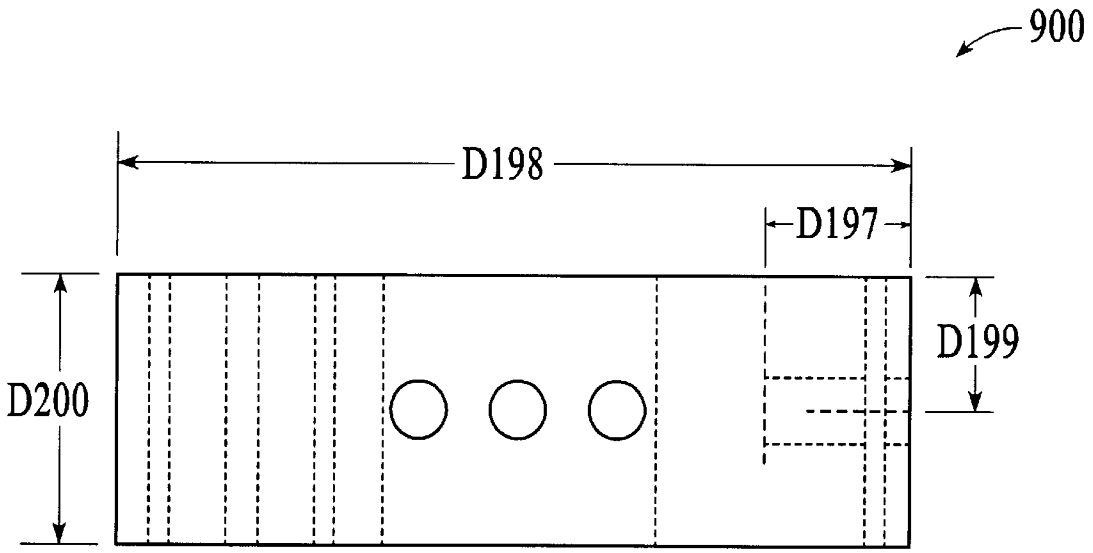
FIG. 9B shows a cross-sectional view of the positioning stage shown in FIG. 9A.
Figure 9C:
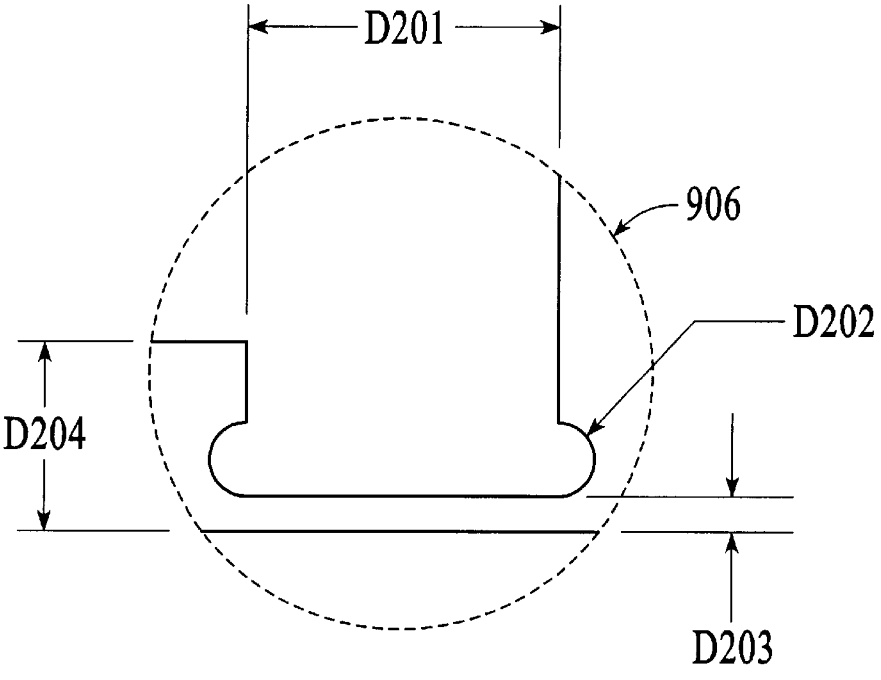
FIG. 9C shows a magnified view of a portion of the positioning stage shown in FIG. 9A.

The dimensions of stage 100 (FIG. 1) depend on its material. Table 2 provides the dimensions of an exemplary stage 900, shown in FIGS. 9A–9C, in accordance with an embodiment of the invention. Stage 900 is of beryllium-copper (Be—Cu). FIG. 9C, a magnified view of a portion of stage 900 indicated by a dashed circle 906 in FIG. 9A, shows the dimensions of flexure bearing 122B of stage 900; the same dimensions also apply to all of the flexure bearings of stage 900. Stage 900 also defines holes 901–905 to accommodate various sensors for closed-loop feedback control. Center 907, which is the center of aperture 151, is offset 0.025 mm left and 0.025 above (i.e. −0.025 mm, 0.025 mm) of the center of stage 900 to compensate for the placement of actuators (not shown).

TABLE 2

| DIMENSION | VALUE in millimeters (mm) | COMMENTS |
|---|---|---|
| D160 | 20.000 | |
| D161 | 19.250 | |
| D162 | 18.750 | |
| D163 | 18.000 | |
| D164 | 17.500 | |
| D165 | 15.710 | |
| D166 | 15.000 | |
| D167 | 5.000 | |
| D168 | 4.000 | |
| D169 | 3.250 | |
| D170 | 2.750 | |
| D171 | 20.000 | |
| D172 | 19.250 | |
| D173 | 18.750 | |

TABLE 2-continued

| DIMENSION | VALUE in millimeters (mm) | COMMENTS |
|---|---|---|
| D174 | 17.210 | |
| D175 | 16.500 | |
| D176 | 15.250 | |
| D177 | 2.250 | |
| D178 | 1.750 | |
| D179 | 1.250 | |
| D180 | 0.750 | |
| D181 | 0.15 | Radius of the bend at the end of the indicated portion of channel 120 of stage 900. |
| D182 | 0.710 | |
| D183 | 7.00 | Diameter of aperture 151 of stage 900. |
| D184 | M7-0.5 thread | Thread size of aperture 151 of stage 900. |
| D185 | 1.53 diameter clear | Diameter of hole 901. Hole 901 is not threaded. |
| D186 | 10.000 | |
| D187 | 7.000 | |
| D188 | 1.500 | D188 and D193 specify the locations of mounting holes 153A and 153B of stage 900. |
| D189 | 0–80 tap | Tap size of hole 902 |
| D190 | 0–80 tap | Tap size of hole 903 |
| D191 | 1.53 diameter clear | Diameter of hole 904. Hole 904 is not threaded. |
| D192 | 0–80 tap | Tap size of hole 905. |
| D193 | 1.500 | See comment on D188. |
| D194 | 7.500 | |
| D195 | 10.000 | |
| D196 | 12.500 | |
| D197 | 3.750 | See FIG. 9B for dimensions D197–D200. Depth of holes 901 and 902. |
| D198 | 20.00 | |
| D199 | 3.50 | Distance from the top surface of stage 900 to the center of holes 901 and 902. |
| D200 | 7.00 | Thickness of stage 900. |
| D201 | 1.00 | See FIG. 9C for dimensions D201–D204. D201–D204 indicate the dimensions of flexure bearing 112D of stage 900. The same dimensions apply to flexure bearings 112A, 112B, 112C, 122A, 122B, 122C, and 122D of stage 900. |
| D202 | 0.15 | Radius of bend. See comment on D201. |
| D203 | 0.15 | See comment on D201. |
| D204 | 0.75 | See comment on D201. |
| D205 | 2.00 diameter clear | Diameter of mounting holes 153A and 153B of stage 900. Holes 153A and 153B are not threaded. |

The stages of the present invention are specially suited to applications requiring a very small stage. As shown in table 2, stage 900 is only 20 mm wide (D171; shown in FIG. 9A), 20 mm long (D160; shown in FIG. 9A), and 7 mm deep (D200; shown in FIG. 9B). Stage 900 can be used, for example, to precisely align an electron source such as a Schottky field emitter in a microcolumn.

The description of the invention given above is provided for purposes of illustration and is not intended to be limiting. Numerous modifications and variations within the scope of the invention are possible. The invention is set forth in the following claims.

What is claimed is:

1. A stage comprising:

a block;

a first elongated channel defined in said block, thereby allowing flexure of an integral portion of said block along a first axis relative to a remainder integral portion of said block;

a second elongated channel defined in said block, thereby allowing flexure of said integral portion of said block along a second axis perpendicular to said first axis relative to the remainder integral portion of said block, wherein said first axis and said second axis are in a single horizontal plane in said block;

a first actuator at least partly in said first elongated channel, said first actuator being operable to flex said integral portion of said block relative to the remainder integral portion of said block along said first axis; and a second actuator at least partly in said second elongated channel, said second actuator being operable to flex said integral portion of said block relative to the remainder integral portion of said block along said second axis.

2. The stage of claim 1 wherein said first and second actuators are piezoelectric actuators.

3. The stage of claim 1 wherein said block is of a material selected from a group consisting of beryllium-copper, silicon, and tungsten.

4. The stage of claim 1 wherein said block occupies an area about four (4) square centimeters or less.

5. The stage of claim 1 further comprising an electron source supported in said block.

6. The stage of claim 5 wherein said electron source is a Schottky field emitter.

7. A positioning stage comprising:

a block;

means for allowing movement of an integral central portion of said block relative to a remainder integral portion of said block along a first axis; and means for allowing movement of said integral central portion of said block relative to the remainder integral portion of said block along a second axis perpendicular to said first axis, wherein said first axis and said second axis lie in a single horizontal plane in said block.

8. The positioning stage of claim 7 further comprising:

means for moving said central portion of said block along said first axis; and means for moving said central portion of said block along said second axis.

9. The positioning stage of claim 8 further comprising an electron source supported in said central portion of said block.

10. An array of positioning stages, each of said positioning stages comprising:

a block;

a first elongated channel defined in said block and thereby allowing flexure of an integral portion of said block relative to a remainder integral portion of said block along a first axis;

a second elongated channel defined in said block and thereby allowing flexure of said integral portion of said block relative to the remainder integral portion of said block along a second axis perpendicular to said first axis, wherein said first axis and said second axis are in a single horizontal plane in said block;

a first actuator in said first elongated channel, said first actuator being operable to flex said integral portion of said block relative to the remainder integral portion of said block along said first axis; and a second actuator in said second elongated channel, said second actuator being operable to flex said integral portion of said block relative to the remainder integral portion of said block along said second axis.

11. The array of claim 10 wherein said positioning stages are in a single block.

12. The array of claim 10 wherein each of said positioning stages are in separate blocks.

13. The array of claim 10 wherein said array occupies an area about sixteen (16) square centimeters or less.

14. The array of claim 11, wherein each of said positioning stages further comprises an electron source supported in said block.

15. The array of claim 11, wherein each of said positioning stages occupies an area of up to approximately four (4) square centimeters.

16. A method for positioning an electron source comprising:

supporting said electron source in an integral central portion of a block;

flexing said integral central portion of said block relative to a remainder integral portion of said block to move said electron source along a first axis; and flexing said integral central portion of said block relative to the remainder integral portion of said block to move said electron source along a second axis perpendicular to said first axis, wherein said first axis and said second axis are in a single horzontal plane in said block.

17. The method for positioning an electron source of claim 16, wherein said flexing said central portion along the first axis comprises actuating a first actuator at least partly located in a first elongated channel defined by the block.

18. The method for positioning an electron source of claim 17, wherein said flexing said central portion along the second axis comprises actuating a second actuator at least partly located in a second elongated channel defined by the block.

19. The method for positioning an electron source of claim 16, wherein the block occupies an area of up to approximately four (4) square centimeters.

20. An electron beam assembly comprising:

an electron source;

a microcolumn;

a block, said block having an integral portion for supporting said electron source aligned with said microcolumn;

a first elongated channel defined in said block, thereby allowing flexure of said integral portion of said block relative to a remainder integral portion of said block along a first axis;

a second elongated channel defined in said block, thereby allowing flexure of said integral portion of said block relative to the remainder integral portion of said block along a second axis perpendicular to said first axis, wherein said first axis and said second axis lie in a single horizontal plane in said block;

a first actuator at least partly located in said first elongated channel for flexing said integral portion of said block relative to the remainder integral portion of said block along said first axis; and a second actuator at least partly located in said second elongated channel for flexing said integral portion of said block relative to the remainder integral portion of said block along said second axis.

* * * * *